(12) United States Patent
Venneri

(10) Patent No.: US 9,620,248 B2
(45) Date of Patent: Apr. 11, 2017

(54) DISPERSION CERAMIC MICRO-ENCAPSULATED (DCM) NUCLEAR FUEL AND RELATED METHODS

(75) Inventor: Francesco Venneri, Los Alamos, NM (US)

(73) Assignee: Ultra Safe Nuclear, Inc., Los Alamos, NM (US)

( * ) Notice: Subject to any disclaimer, the term of this patent is extended or adjusted under 35 U.S.C. 154(b) by 627 days.

(21) Appl. No.: 13/567,243

(22) Filed: Aug. 6, 2012

(65) Prior Publication Data
US 2017/0040069 A1 Feb. 9, 2017

Related U.S. Application Data

(60) Provisional application No. 61/515,151, filed on Aug. 4, 2011.

(51) Int. Cl.
*G21C 3/17* (2006.01)
(52) U.S. Cl.
CPC ..................... *G21C 3/17* (2013.01)
(58) Field of Classification Search
USPC ............................. 376/901; 3/901
See application file for complete search history.

(56) References Cited

U.S. PATENT DOCUMENTS

| 3,276,968 A * | 10/1966 | Ingleby ............ B01J 2/18 376/411 |
| 3,619,241 A * | 11/1971 | Goedell ............ C23C 16/26 376/411 |
| 3,907,948 A | 9/1975 | Gyarmati et al. |
| 4,707,330 A | 11/1987 | Ferrari |
| 4,869,886 A | 9/1989 | Saiki |
| 4,978,480 A | 12/1990 | Stansfield |
| 5,805,657 A | 9/1998 | Heubeck |
| 6,162,543 A | 12/2000 | Dubots |
| 8,475,747 B1 | 7/2013 | Johnson |
| 8,774,344 B1 * | 7/2014 | Wells ............ G21C 3/626 252/636 |
| 2003/0112919 A1 * | 6/2003 | Davies ............ G21C 1/07 376/381 |
| 2003/0113447 A1 | 6/2003 | Sherwood et al. |
| 2006/0039524 A1 | 2/2006 | Feinroth |

(Continued)

FOREIGN PATENT DOCUMENTS

WO WO 2008/071676 A1 6/2008
WO WO 2010/086431 A1 8/2010

OTHER PUBLICATIONS

M.K. Meyer et al., "Fuel Development for Gas-Cooled Fast Reactors," Journal of Nuclear Materials, 371 (2007), pp. 281-287.

(Continued)

*Primary Examiner* — Sean P Burke
(74) *Attorney, Agent, or Firm* — RatnerPrestia

(57) ABSTRACT

The invention relates to the use of Dispersion Ceramic Micro-Encapsulated (DCM) nuclear fuel as a meltdown-proof, accident-tolerant fuel to replace uranium dioxide fuel in existing light water reactors (LWRs). The safety qualities of the DCM fuel are obtained by the combination of three strong barriers to fission product release (ceramic coatings around the fuel kernels), highly dense inert ceramic matrix around the coated fuel particles and metallic or ceramic cladding around the fuel pellets.

16 Claims, 14 Drawing Sheets

(56) References Cited

U.S. PATENT DOCUMENTS

| | | |
|---|---|---|
| 2008/0159464 A1 | 7/2008 | Futterer |
| 2009/0032178 A1 | 2/2009 | Feinroth |
| 2010/0290578 A1 | 11/2010 | Farrell |
| 2010/0296621 A1 | 11/2010 | Broli et al. |
| 2011/0091004 A1 | 4/2011 | Farmer |
| 2011/0317794 A1 | 12/2011 | Venneri et al. |
| 2012/0140867 A1 | 6/2012 | Venneri et al. |

OTHER PUBLICATIONS

K.D. Weaver et al., "Gen IV Nuclear Energy Systems: Gas-Cooled Fast reactor (GFR)," FY-04 Annual Report, Sep. 2004, Idaho National Engineering and Environmental Laboratory, INEEL/EXT-04-02361.

Sterbentz, J.W. et al., "Reactor Physics Parametric and Depletion Studies in Support of TRISO Particle Fuel Specification for the Next Generation Nuclear Plant," INEEL/EXT-04-02331, Sep. 2004, Idaho National Engineering and Environmental Laboratory, Idaho Falls, Idaho.

TRISO-Coated Particle Fuel Phenomenon Identification and Ranking Tables (PIRTs) for Fission Product Transport Due to Manufacturing, Operations, and Accidents, NUREG-6844, vol. 1, Jul. 2004, U.S. Nuclear Regulatory Commission, Washington, DC.

TRISO-Coated Particle Fuel Phenomenon Identification and Ranking Tables (PIRTs) for Fission Product Transport Due to Manufacturing, Operations and Accidents, Appendices A through D, NUREG-6844, vol. 2, Jul. 2004, U.S. Nuclear Regulatory Commission, Washington DC.

TRISO-Coated Particle Fuel Phenomenon Identification and Ranking Tables (PIRTs) for Fission Product Transport Due to Manufacturing, Operations and Accidents, Appendices E through I, NUREG-6844 vol. 3, Jul. 2004, U.S. Nuclear Regulatory Commission, Washington DC.

* cited by examiner

Table 1

| | Fuel | Density | Enrichment | Geometry Factor | Fissile U Density | Normalized Fissile Density | Required Enrichment |
|---|---|---|---|---|---|---|---|
| Nominal LWR | UO2 | 9.5 -> 10.2 | 4 | 1 | 38 | 1.00 | 4.00 |
| Same Pin Diameter 1 kernel size | UC | 12.5 | 20 | 0.1 | 25 | 0.66 | 30.40 |
| | UN | 13.5 | 20 | 0.1 | 27 | 0.71 | 28.15 |
| | U3Si | 14.5 | 20 | 0.1 | 29 | 0.76 | 26.21 |
| Larger Pin Diameter 1 kernel size | UC | 12.5 | 20 | 0.14 | 35 | 0.92 | 21.71 |
| | UN | 13.5 | 20 | 0.14 | 37.8 | 0.99 | 20.11 |
| | U3Si | 14.5 | 20 | 0.14 | 40.6 | 1.07 | 18.72 |
| Larger Pin Diameter 2 kernel sizes | UC | 12.5 | 20 | 0.2 | 50 | 1.32 | 15.20 |
| | UN | 13.5 | 20 | 0.2 | 54 | 1.42 | 14.07 |
| | U3Si | 14.5 | 20 | 0.2 | 58 | 1.53 | 13.10 |

FIG. 14

Table 2

| | Case ID | Fuel | Density | Enrichment | Geometry Factor | Fissile U Density | Normalized Fissile Density | Required Enrichment |
|---|---|---|---|---|---|---|---|---|
| Nominal LWR | Case 1 | UO2 (solid) | 9.5 -> 10.2 | 4 | 1 | 38 | 1.00 | 4.00 |
| Same Pin Diameter 1 kernel size | Case 2 | UO2 (TRISO) | 10.2 | 20 | 0.1 | | | |
| | Case 3 | UC | 12.5 | 20 | 0.1 | 25 | 0.66 | 30.40 |
| | Case 4 | UN | 13.5 | 20 | 0.1 | 27 | 0.71 | 28.15 |
| | n/a | U3Si | 14.5 | 20 | 0.1 | 29 | 0.76 | 26.21 |
| Larger Pin Diameter 1 kernel size | Case 5 | UC | 12.5 | 20 | 0.14 | 35 | 0.92 | 21.71 |
| | Case 6 | UN | 13.5 | 20 | 0.14 | 37.8 | 0.99 | 20.11 |
| | n/a | U3Si | 14.5 | 20 | 0.14 | 40.6 | 1.07 | 18.72 |
| Larger Pin Diameter 2 kernel sizes | Case 7 | UC | 12.5 | 20 | 0.2 | 50 | 1.32 | 15.20 |
| | Case 8 | UN | 13.5 | 20 | 0.2 | 54 | 1.42 | 14.07 |
| | n/a | U3Si | 14.5 | 20 | 0.2 | 58 | 1.53 | 13.10 |

FIG. 15

Table 3

- Pellet Diameter, Kernel Diameter and Packing Fraction

| Pellet Radius [cm] | Pellet Height [cm] | Kernel Radius [cm] | Buffer Radius [cm] | IPyC Radius [cm] | SiC Radius [cm] | OPyC Radius [cm] | Packing Fraction [%] | Pellet Volume [cm^3] | TRISO Volume [cm^3] | Number of TRISO | Real Packing Fraction [%] |
|---|---|---|---|---|---|---|---|---|---|---|---|
| 0.4095 | 1.0000 | 0.0375 | 0.0475 | 0.0510 | 0.0545 | 0.0585 | 45.0 | 0.52681 | 0.00084 | 282.0 | 44.88980 |
| 0.4709 | 1.0000 | 0.0375 | 0.0475 | 0.0510 | 0.0545 | 0.0585 | 45.0 | 0.69671 | 0.00084 | 373.0 | 44.89642 |
| 0.4709 | 1.0000 | 0.0200 | 0.0300 | 0.0335 | 0.0370 | 0.0410 | 3.0 | 0.69671 | 0.00029 | 72.0 | 2.98345 |
| 0.4709 | 1.0000 | 0.0500 | 0.0600 | 0.0635 | 0.0670 | 0.0710 | 44.0 | 0.69671 | 0.00150 | 204.0 | 43.89757 |

FIG. 16

Table 4

• Heavy Metal Mass in a Pellet (unit height)

| Case ID | Fuel Type | Pellet Diameter Case | Kernel Diameter | No. of TRISO | HM Mass (gram/cm) | | | Index |
|---|---|---|---|---|---|---|---|---|
| | | | | | U-235 | U-238 | Total | |
| Case 1 | UO2 | Nominal | n/a | n/a | 1.8950E-01 | 4.5470E+00 | 4.7365E+00 | 100.00% |
| Case 2 | UO2 | Nominal | 750 | 282 | 1.1199E-01 | 4.4796E-01 | 5.5995E-01 | 11.82% |
| Case 3 | UC | Nominal | 750 | 282 | 1.4824E-01 | 5.9296E-01 | 7.4120E-01 | 15.65% |
| Case 4 | UN | Nominal | 750 | 282 | 1.5882E-01 | 6.3530E-01 | 7.9412E-01 | 16.77% |
| Case 5 | UC | Larger | 750 | 373 | 1.9608E-01 | 7.8431E-01 | 9.8038E-01 | 20.70% |
| Case 6 | UN | Larger | 750 | 373 | 2.1008E-01 | 8.4031E-01 | 1.0504E+00 | 22.18% |
| Case 7 | UC | Large 2 types | 750 | 373 | 1.9608E-01 | 7.8431E-01 | 1.0091E+00 | 21.30% |
| | | | 400 | 72 | 5.7418E-03 | 2.2967E-02 | | |
| Case 8 | UN | Larger 2 types | 750 | 373 | 2.1008E-01 | 8.4031E-01 | 1.0811E+00 | 22.83% |
| | | | 400 | 72 | 6.1517E-03 | 2.4607E-02 | | |
| Case 9 | UC | Largest | 1000 | 204 | 2.5419E-01 | 1.0168E+00 | 1.2710E+00 | 26.83% |
| Case 10 | UN | Largest | 1000 | 204 | 2.7234E-01 | 1.0894E+00 | 1.3617E+00 | 28.75% |

FIG. 17

DISPERSION CERAMIC MICRO-ENCAPSULATED (DCM) NUCLEAR FUEL AND RELATED METHODS

This application claims the benefit of U.S. Provisional Application No. 61/515,151 (filed Aug. 4, 2011), which is incorporated by reference.

BACKGROUND OF INVENTIONS

Field of the Inventions

The present inventions relates generally to nuclear technologies. More specifically, particular embodiments of the inventions claimed herein relates to nuclear fuels and related methods for use in various types of nuclear reactors.

Description of Related Art

Nuclear fuel is what is "consumed" by fission to produce energy in a nuclear reactor. Nuclear fuels are very high-density energy sources and it is clear from the initial analysis of the March 2011 Fukushima accident that the failure of the nuclear fuel after shutdown has been the most important cause of the damage to the reactors and the environment. The immediate reason for the fuel failure was the lack of adequate cooling for the decay heat generated after reactor shutdown. The fact that the fuel failed rather rapidly and uncontrollably soon after cooling was compromised, however, points to substantial inherent weaknesses in this component of the nuclear reactor.

Oxide fuels such as uranium dioxide are commonly used in today's reactors because they are relatively simple and inexpensive to manufacture and can achieve very high effective uranium densities, have a high melting point and are inert to air They also provide well-established pathways to reprocessing. The thermal conductivity of these fuels, however, is very low and goes down as the temperature goes up. The low thermal conductivity can lead to overheating of the center part of the pellets during use and difficulty in heat dissipation during loss of coolant events.

Virtually all fuel used in light water reactors (LWRs) is uranium dioxide ($UO_2$). The uranium dioxide powder is compacted into cylindrical pellets and sintered at high temperatures to produce ceramic nuclear fuel pellets with a high density. Such fuel pellets are then stacked into metallic tubes (cladding). Cladding prevents radioactive fission fragments from escaping from the fuel into the coolant and contaminating it. The metal used for the tubes depends on the design of the reactor. Stainless steel was used in the past, but most reactors now use a zirconium alloy which, in addition to being highly corrosion-resistant, has low neutron absorption. The use of zirconium instead of stainless steel allows lower enrichment fuel to be used for similar operating cycles. Zirconium, however, is much more prone to react with steam to produce hydrogen at high temperatures Recently, micro-encapsulated tristructural-isotropic (TRISO) fuel particles compacted within a graphite matrix have been proposed for the next generation gas-cooled reactors. A TRISO fuel particle comprises a kernel of fissile/fertile material coated with several isotropic layers of pyrolytic carbon (PyC) and silicon carbide (SiC). These TRISO particles are combined with a graphite matrix material and pressed into a specific shape. While the TRISO fuel forms offer better fission product retention at higher temperatures and burnups than metallic fuel forms, they also provide only one containment shell (i.e., SiC layer) against fission product release to the coolant, and some fission products may migrate out of the kernel and through the outer layers and escape into the graphite matrix and coolant.

The sealed tubes containing the fuel pellets are called fuel rods. The fuel rods are grouped into fuel assemblies that are used to build up the core of a power reactor.

The fuel assemblies consist of fuel rods bundled in arrangements of 14×14 to 17×17 depending on the core design. One type of fuel is known as pressurized water reactor fuel, or PWR. PWR bundles are about 4 meters in length. In PWRs, control rods are inserted through the top directly into the fuel bundle.

Another type of fuel is known as boiling water reactor fuel, or BWR. The fuel assemblies in BWRs are "canned" within a thin tube surrounding each bundle. As the water physically changes phase and boils as it moves up through the BWR assemblies, the canned arrangement is adopted to prevent local density variations from affecting neuronics and thermal hydraulics of the overall reactor. There are typically 91 to 96 fuel rods per assembly and 400-800 assemblies in the reactor core. Control rods are inserted from the bottom as cruciform blades surrounding the canned assemblies.

Nuclear fuel, like any material in a high-radiation environment, can undergo substantial changes in its properties during reactor operations. Moreover, the occurrence of nuclear reactions will cause significant changes in the fuel stoichiometry over time, leading to cracking and fission gas release. As the fuel is degraded and cracks, the more volatile fission products trapped within the uranium dioxide may become free to move into the fuel-clad gap. As the fuel pin is sealed, the pressure of the gas filling the gap will increase and it is possible to deform and burst the cladding. The swelling of the fuel can also impose mechanical stresses on the cladding.

Once the geometry of the fuel rod is changed by excessive swelling, its heat transfer behavior may be degraded, with significant increase in the temperature of the cladding possible. The common failure process of fuel in the water-cooled reactors is a transition to film boiling and subsequent ignition of zirconium cladding in the steam. In a loss-of-coolant accident (LOCA) the surface of the cladding could teach a temperature between 800 and 1400° K., and the cladding will be exposed to steam for some time before water is re-introduced into the reactor to cool the fuel. During this time when the hot cladding is exposed to steam, some oxidation of the zirconium will occur to form a zirconium oxide and produce hydrogen. The oxidation can produce breaching of the fuel clad and subsequent release of the radioactive fission products.

The vast majority of nuclear fuels used today consist of uranium dioxide ($UO_2$) pellets stacked inside a sealed cladding tube of zirconium alloy to make a fuel rod. Such fuels have three main weaknesses, however: (1) the presence of large amounts of zirconium in the clad that can react with steam at high temperature to produce hydrogen, (2) the fact that the fission products are only loosely bound to the fuel after they are produced, and (3) the very low conductivity of the fuel itself, which causes very high temperatures in the fuel and impedes the cooling of the fuel during off-normal situations. A fuel clad with a less reactive metal (like stainless steel) or a non-metal, having a higher conductivity (like a carbide or nitride fuel) and tightly bound fission products, would not have produced the large amounts of hydrogen responsible for the explosions at the Fukushima plant or the high temperatures responsible for the rapid failures after toss of cooling and the large releases of radioactivity that occurred after fuel failure.

It is clear that oxide fuels in zirconium cladding, the form most commonly used in LWRs, are vulnerable to LOCA conditions and can fail in catastrophic ways, due to (1) the adverse combination of a chemically active cladding, (2) loosely bound fission products, and (3) poor heat transfer capabilities. Thus, there exists a need for alternatives to oxide fuels that can be used to mitigate these concerns.

SUMMARY OF THE INVENTIONS

Although the present inventions may obviate one or more of the above-mentioned needs, it should be understood that some aspects of the inventions might not necessarily obviate one or more of those needs.

In the following description, certain aspects and embodiments will become evident it should be understood that these aspects and embodiments are merely exemplary and the inventions, in its broadest sense, could be practiced without having one or more features of these aspects and embodiments.

To attain the advantages and in accordance with the purpose of the inventions, as embodied and broadly described herein, one aspect of the inventions may provide a nuclear fuel comprising a dispersion ceramic micro-encapsulated (DCM) nuclear fuel pin. In order to obtain a feasible fuel replacement in nuclear reactors, the DCM fuel pin needs to behave in essentially the same way as standard $UO_2$ fuel pins in terms of power generation, thermo-hydraulics and neutronics, so that a $UO_2$ fuel assembly could be one-for-one replaced with a DCM fuel assembly. It is therefore necessary to achieve comparable levels of linear fissile density and reactivity behavior in the DCM fuel as in the original low-enrichment uranium fuel throughout the operational fuel life in the reactor.

Dispersion ceramic micro-encapsulated (DCM) fuel is manufactured from kernels of uranium bearing material of the highest possible density such as uranium nitride (UN), uranium carbide (UC), uranium silicide ($U_3Si$), or an equivalent material. The methods for obtaining these materials are well-known in the art and may include a sol-gel method or other. Similarly, methods for coating the kernels are well-known and may include: (1) a layer of porous carbon to provide a suitable absorptive buffer for fission products and other gases generated during operations, (2) a thin layer of dense pyrolitic carbon, (3) a dense layer of silicon carbide, and (4) an external layer of pyrolitic carbon to provide structural strength and a pressure tight containment of fission products generated in the kernel. The coated particles containing the fissile uranium may then be overcoated in a slurry of silicon carbide and finally enclosed in a mixture of silicon carbide (over 90%) and yttrium and aluminum oxide nano-powders that is compressed and heated to produce a uniform high density sintered compact. The compact maintains good mechanical strength at high temperatures, has excellent radiation tolerance and high thermal conductivity, due to the continuous high density SiC matrix. It is also non-reactive with water and high temperature steam. Because of its good heat conductivity, the maximum temperature reached in the fuel is well below 1000° K., not high enough to drive diffusion mechanisms that would lead to migration and dispersion of the fission products out of the fuel coatings.

In some exemplary embodiments, the inventions may replace $UO_2$ nuclear fuel material with uranium nitride (UN), uranium carbide (UC) or uranium silicide ($U_3Si$), all of which provide substantially higher heavy metal density than $UO_2$.

In other exemplary embodiments, the nuclear fuel may use two or more sizes of TRISO particles in the compacts, which will increase the achievable packing fraction.

In another exemplary embodiment of the inventions the fuel will use a very dense SiC matrix, obtained by the use of a low-temperature nano-powder sintering process such as a nano infiltration transient eutectic phase (NITE) or equivalent process to provide near-complete filling of the space between TRISO particles.

In still another exemplary embodiment of the inventions, the TRISO particles may include a SiC overcoat prior to sintering of the compact in order to provide a suitable interface between the TRISO particle and the compact matrix.

In yet another exemplary embodiment of the inventions, the nuclear fuel pellets may have an increased diameter of about 15%, thereby decreasing the pellet-to-clad gap. This is possible due to the higher thermal conductivity and good radiation stability of the DCM fuel.

Yet another exemplary embodiment of the inventions may increase the fuel enrichment to between 10 and 20% or more if allowed by regulations.

Another exemplary embodiment of the inventions may provide adequate amounts of burnable poison in the fuel pins by means of resonant absorbers gadolinium (Gd) or erbium (Er) to counteract the larger initial excess reactivity and the softer spectrum.

It is one purpose of the inventions to maintain the same lattice configuration and overall dimensions in the fuel assemblies during operation.

BRIEF DESCRIPTION OF THE DRAWINGS

The accompanying drawings, which are incorporated in and constitute a part of this specification, illustrate several embodiments of the inventions and together with the description, serve to explain the principles of the inventions. The patent or application file contains at least one drawing executed in color. Copies of this patent or patent application publication with color drawing(s) will be provided by the Office upon request and payment of the necessary fee.

FIGS. 14-17 contain Tables 1-4 and show the results of using different material and kernel sizes.

DESCRIPTION OF THE EMBODIMENTS

Figure 1:
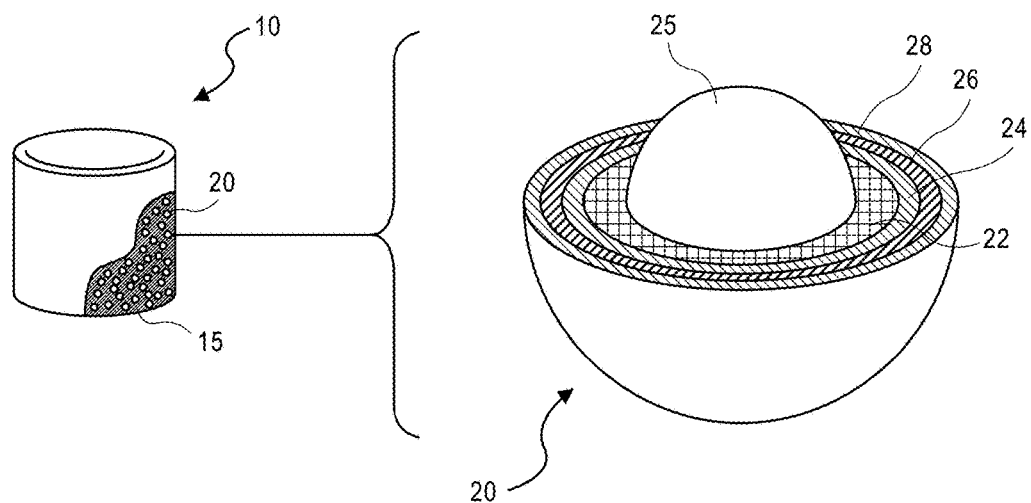
FIG. 1 is a schematic illustration of various constituents of a fuel element, according to one exemplary embodiment of the inventions.

Reference will now be made in detail to the exemplary embodiments consistent with the present inventions, examples of which are illustrated in the accompanying drawings. Wherever possible, the same reference characters will be used throughout the drawings to refer to the same or like parts.

Dispersion fuels consist of a distribution of discrete fuel particles embedded in a non-fuel matrix. Ideally, the matrix remains largely not affected by neutron and fission fragment damage from the fission events that take place in the fuel particles.

The best composite fuel uses fully encapsulated coated fuel particles embedded in an inert heat-conductive matrix and surrounded by a metallic or ceramic clad. In a well-designed dispersion fuel, there are three very strong barriers to fission product release to the coolant. These are the coating around the particle, the dense matrix, and the cladding around the dispersion fuel block, each of them independently capable of containing the fission products and chemically inactive.

Given the available irradiation behavior database, the concept most likely to minimize fission gas release to the coolant will incorporate "buffered" particles in a dense matrix. This "buffer" material serves the dual role of providing volume for fission gas and providing volume for fuel particle swelling. The buffer layer is protected by a dense coating layer, also designed to provide for fission product retention. These are essentially TRISO coated fuel particles.

TRISO fuel is a type of micro fuel particle that can be used effectively as the discrete fuel particles of a dispersion fuel concept. The term "TRISO," as used herein, may refer to any type of micro fuel particle consisting of a fuel kernel composed of UC or uranium oxycarbide (UCO) in the center, coated with one or more layers surrounding one or more isotropic materials. In one preferred embodiment, TRISO particles include four layers of three isotropic materials. In that embodiment, the four layers are a porous buffer layer made of carbon, followed by a dense inner layer of pyrolytic carbon (PyC), followed by a ceramic layer of SiC to retain fission products at elevated temperatures and to give the TRISO particle a strong structural integrity, followed by a dense outer layer of PyC. TRISO fuel particles are designed not to crack due to the stresses or fission gas pressure at temperatures beyond 1600° C., and therefore can contain the fuel in the worst of accident scenarios. TRISO fuel was designed for use in high temperature gas cooled reactors, to be operating at temperatures much higher than the temperatures of LWRs.

Of the possible matrix materials, silicon carbide (SiC) offers the largest existing database in terms of material properties, irradiation behavior, and fabrication. SiC has excellent oxidation resistance due to rapid formation of a dense, adherent silicon dioxide ($SiO_2$) surface scale on exposure to air at elevated temperature, which prevents further oxidation. The low irradiation swelling behavior of SiC is well documented. Processing of SiC into dense shapes is currently done on an industrial scale at a reasonable cost, although major modifications will be required for processing of particle fueled composites.

The use of coated particles makes it more difficult to achieve high heavy metal density in the fuel, since the net heavy metal density within a fuel particle falls rapidly with increasing coating thickness. This fact requires that the coating thickness to kernel diameter ratio be kept as small as possible while maintaining utility as a fission product barrier. It is however clear that the use of dispersion fuels in LWRs will demand higher enrichment and a lower power density. The most likely fissile particle types for composite fuels are uranium/plutonium carbides (UC or PuC) and uranium/plutonium nitrides (UN or PuN) due to the combination of high melting temperature and high actinide density. Uranium silicides could provide an even higher density of fissile uranium, but may be unstable under the expected fabrication and operation conditions.

Figure 6:
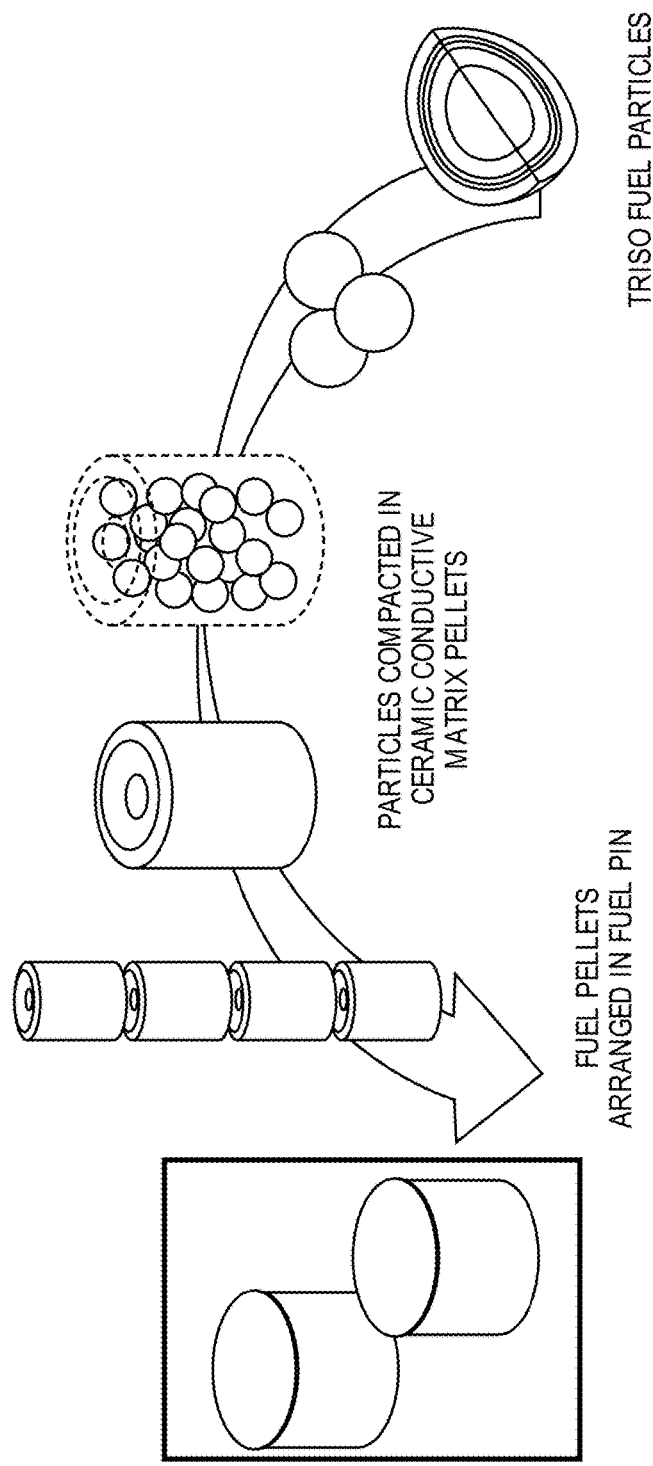
FIG. 6 illustrates the fabrication process of DCM fuel for use in LWRs.

The dispersion fuel consisting of the combination of TRISO fuel particles and silicon carbide matrix in a ceramic cladding is known as dispersion ceramic micro-encapsulated (DCM) fuel. FIG. 6 conceptually illustrates the fabrication process of DCM fuel for use in the LWRs.

DCM fuel consists of UN or UC TRISO particles that are embedded inside a SiC matrix. This fuel design differs significantly from the previous dispersion type fuel approaches, since the damage due to 100 MeV fission fragments and noble gas release is fully contained within the TRISO particle and the inert SiC matrix is solely exposed to neutron irradiation. In addition to offering exceptional stability under neutron irradiation conditions (less than 1% swelling) the thermal conductivity of the SiC matrix is on the order of about 10 times higher than that of uranium dioxide. The fuel development and qualification process for DCM fuel has benefited from and will significantly be facilitated by decades of gas reactor TRISO fuel development and optimization activities.

Figure 2:
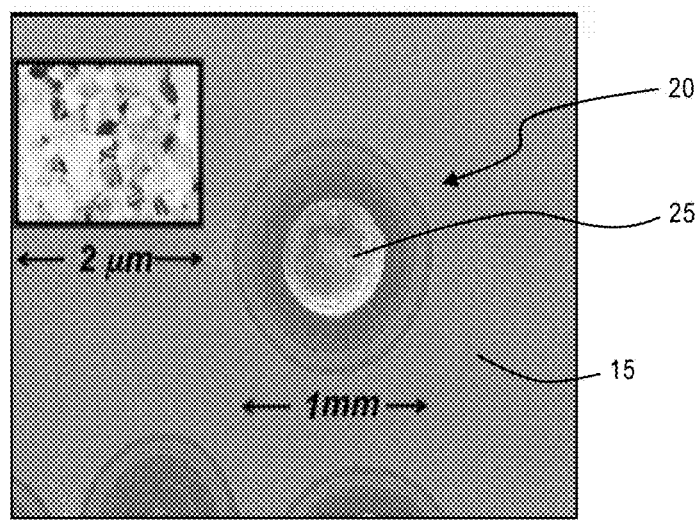
FIG. 2 is a partial cross-sectional, microscopic view of the fuel element shown in FIG. 1.
Figure 3:
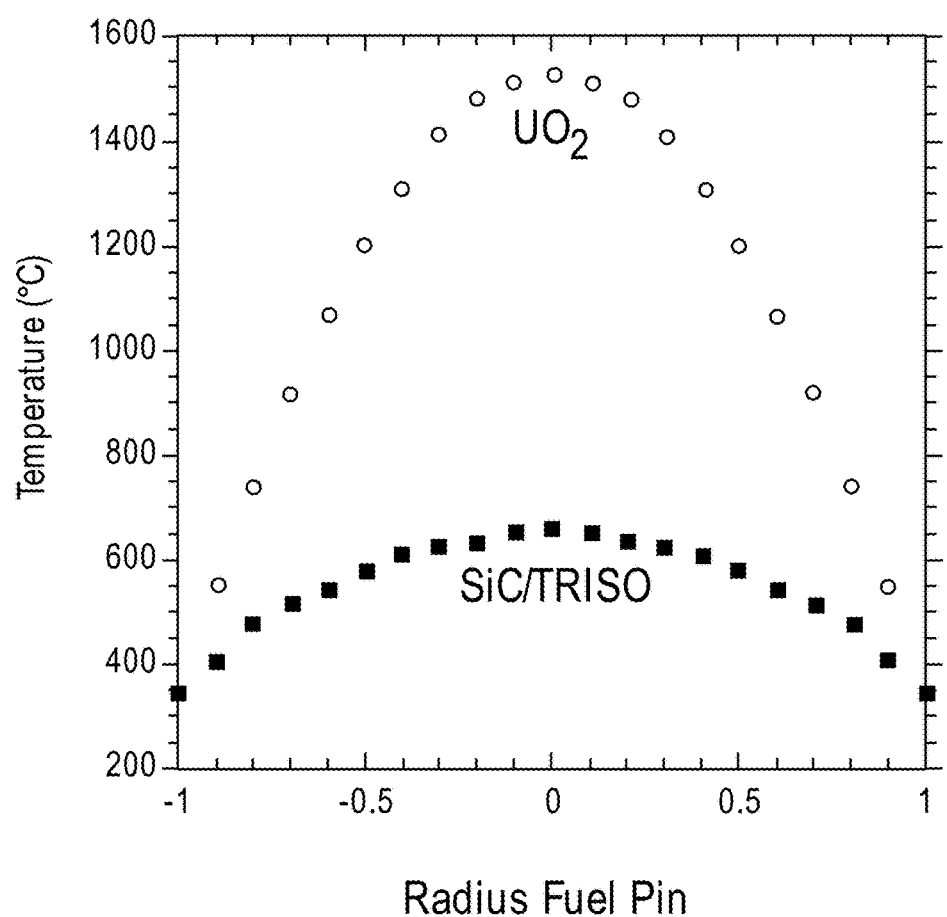
FIG. 3 is a graph illustrating a temperature profile of the fuel element of FIG. 1 as compared to a conventional $UO_2$ fuel element.

FIGS. 1-3 illustrate an exemplary nuclear fuel element consistent with various aspects of the present inventions. While the inventions may be described in connection with particular reactor types (e.g., light water reactors, boiling water reactors, and gas-cooled reactors), embodiments of the inventions may be used, or modified for use, in any other types of nuclear reactors, such as heavy water reactors, liquid metal reactors, and thermoionic nuclear converters.

Referring to FIG. 1, a fuel element 10, according to one exemplary embodiment, may comprise a plurality of micro-encapsulated fuel particles 20 embedded in a silicon carbide (SiC) matrix 15. The fuel element 10 may be formed by compressing a mixture of the fuel particles 20 and a SiC-based matrix precursor material in a mold. The mold may have any desired shape for the fuel element 10. In one exemplary embodiment, the SiC-based matrix precursor material may comprise SiC powder mixed with sintering additives and may be in a form of powder-based slurry, ceramic slurry for tape casting, or any other mixture type known in the art. Because the SiC matrix 15 is a ceramic material, the fuel element 10 is sometimes referred to as a fully ceramic micro-encapsulated fuel element.

While the fuel element 10 of FIG. 1 has a shape of a cylindrical pellet, particularly suitable for use in a conventional light water reactor, the fuel element may have a variety of other shapes, such as, for example, a sphere or an elongated rod, depending on the type and/or operational characteristics of the nuclear reactor in which the fuel element is intended to be used. The fabrication process and the resulting properties and characteristics of the fuel element 10 will be described in more detail later.

The fuel particles 20 dispersed in the SiC matrix 15 may be tristructural isotropic (TRISO) fuel particles. The term "TRISO fuel particle," as used herein, may refer to any type of micro fuel particle comprising a fuel kernel and one or more layers of isotropic materials surrounding the fuel kernel. By way of example only, the fuel particle 20 may have a diameter of about 1 millimeter.

As shown in FIG. 1, the fuel particle 20 may comprise a fuel kernel 25 at its center. The fuel kernel 25 may comprise fissile and/or fertile materials (e.g., uranium, plutonium, thorium, etc.) in an oxide, carbide, or oxycarbide form. In one exemplary embodiment, the fuel kernel 25 may comprise low enriched uranium (LEU) of any suitable enrichment level.

The fuel kernel 25 may be coated with four distinct layers: (1) a porous carbon buffer layer 22; (2) an inner pyrolytic carbon (PyC) layer 24; (3) the ceramic layer 26; and (4) an outer pyrolytic carbon (PyC) layer 28.

Figure 7:
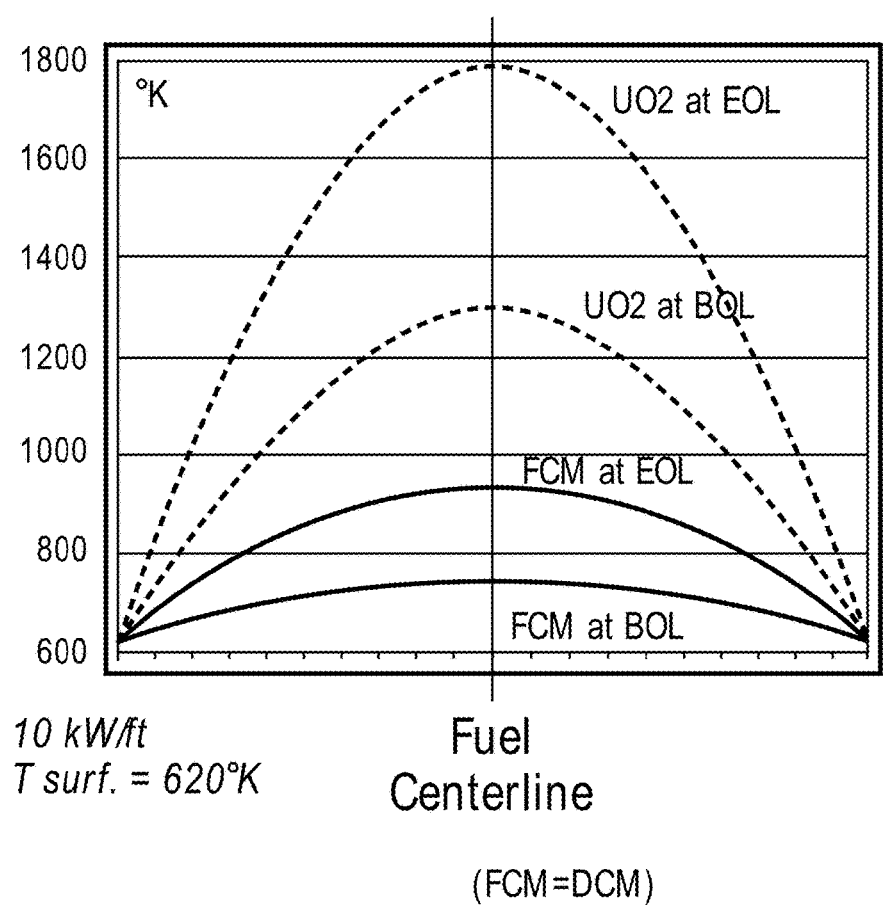
FIG. 7 is a graph illustrating a temperature profile of the fuel element of FIG. 6 as compared to a conventional $UO_2$ fuel element.
Figure 8:
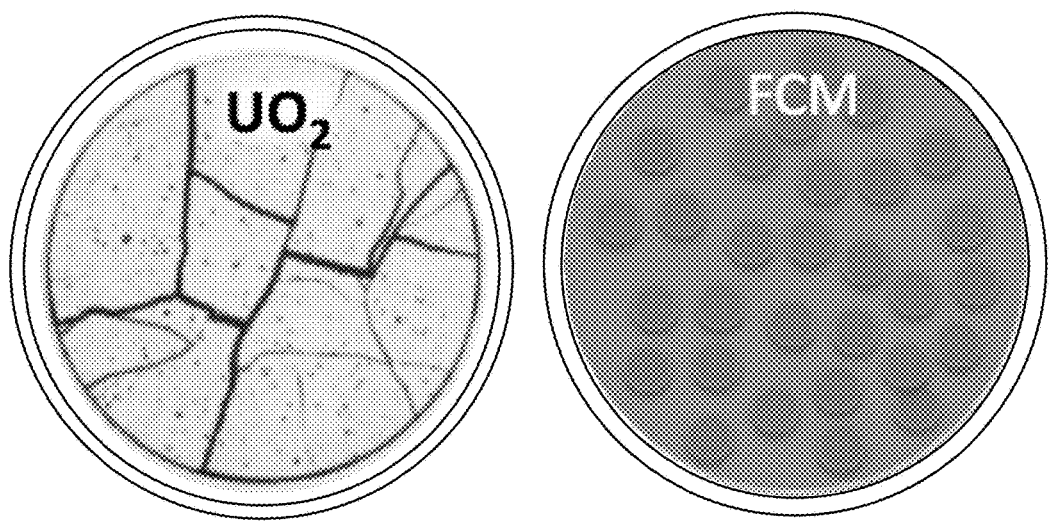
FIG. 8 illustrates the behavior of different nuclear fuels during operation.

The modeled behavior of DCM fuel is illustrated in FIG. 7, highlighting the much lower fuel temperature during operations relative to oxide fuels (due to the much higher heat conductivity of the SiC matrix and the UC or UN fuel particle). As shown in FIG. 8, the oxide fuel will swell, crack and release the volatile fission products into the clad enclosure, whereas the DCM fuel will retain all fission products inside the TRISO particles and will not swell under irradiation.

Figure 9:
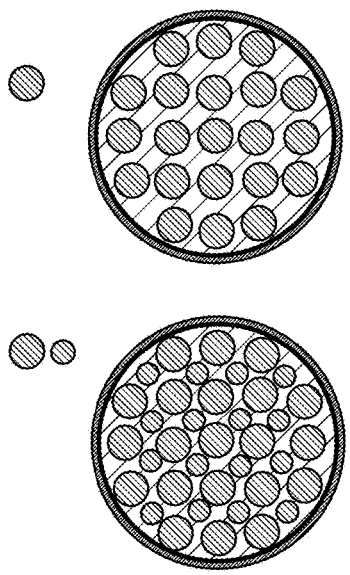
FIG. 9 illustrates the different packing results achieved using two or more different sizes of TRISO particles.
Figure 10:
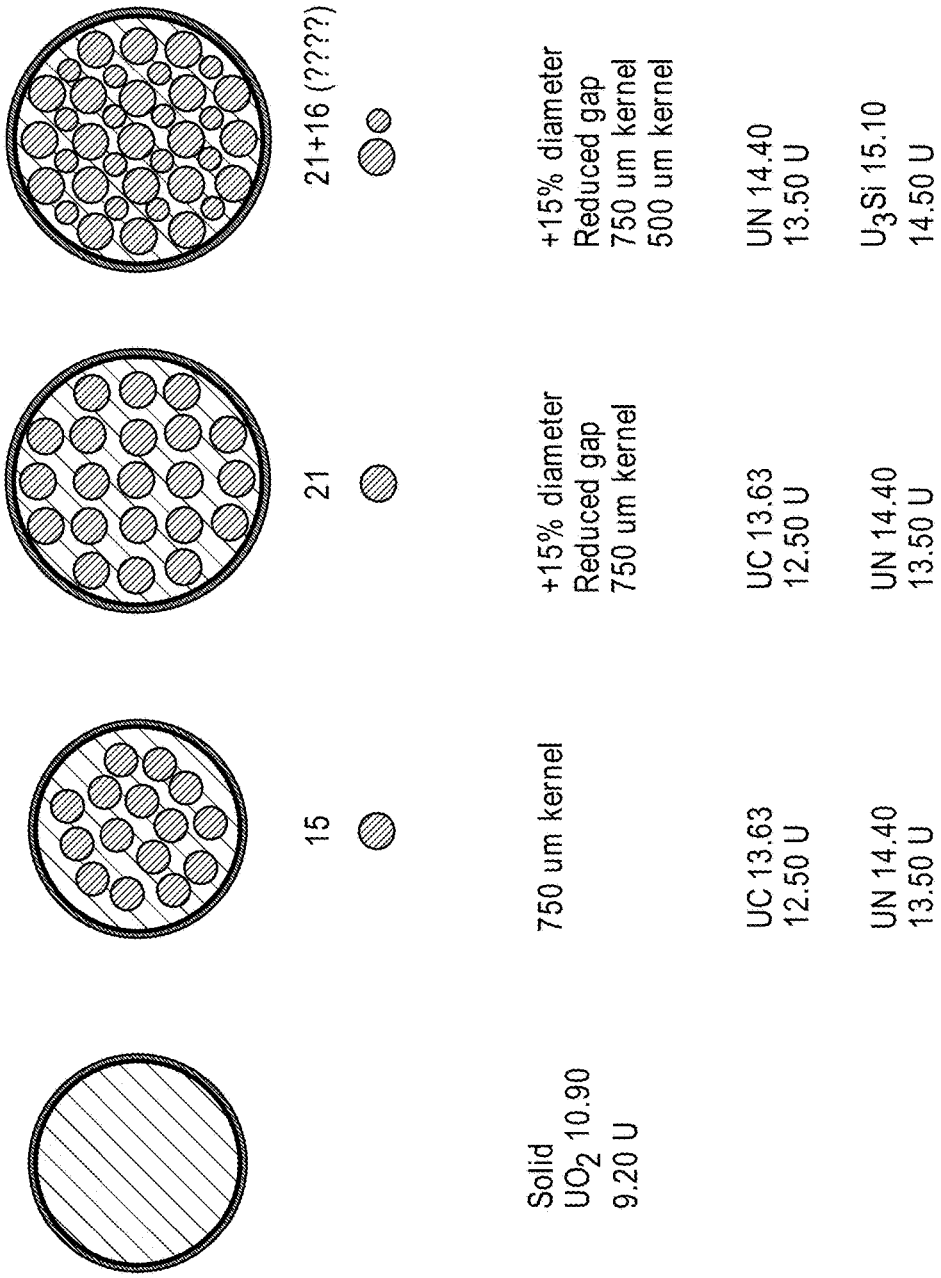
FIG. 10 illustrates the different packing results achieved using two or more different sizes of TRISO particles.
Figure 11:
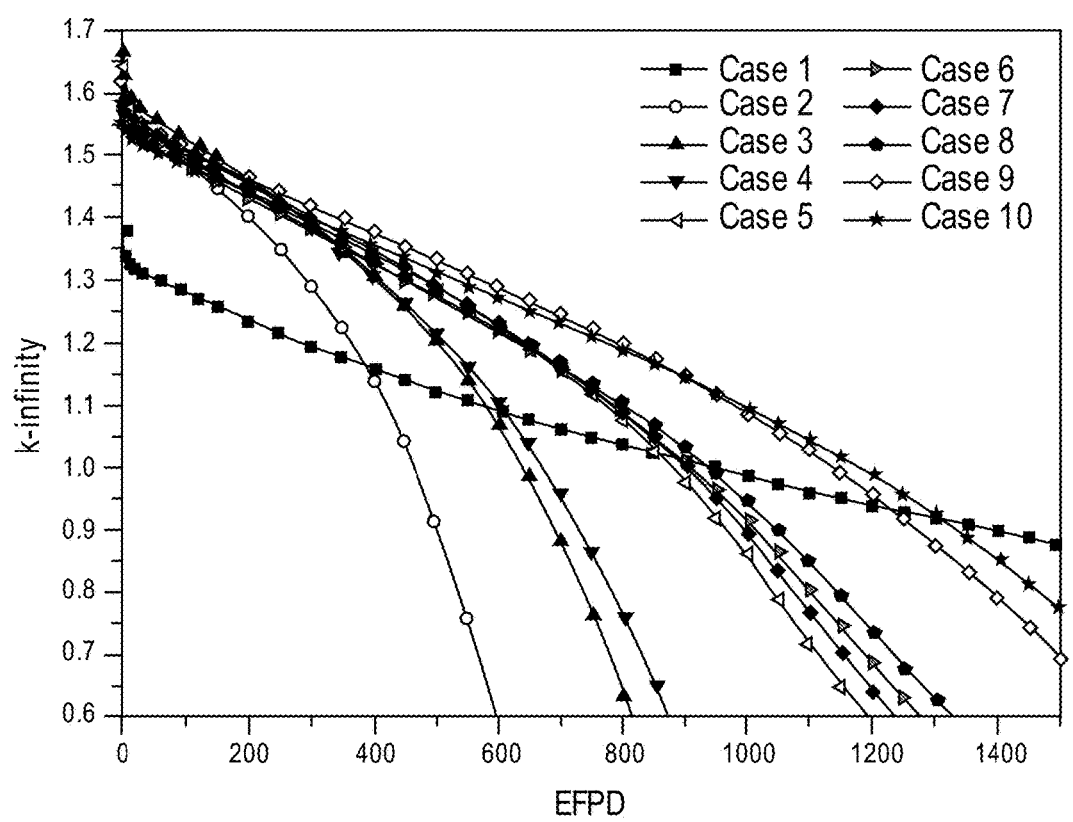
FIG. 11 is a graph illustrating the k-infinity evolution of various fuel arrangements.
Figure 12:
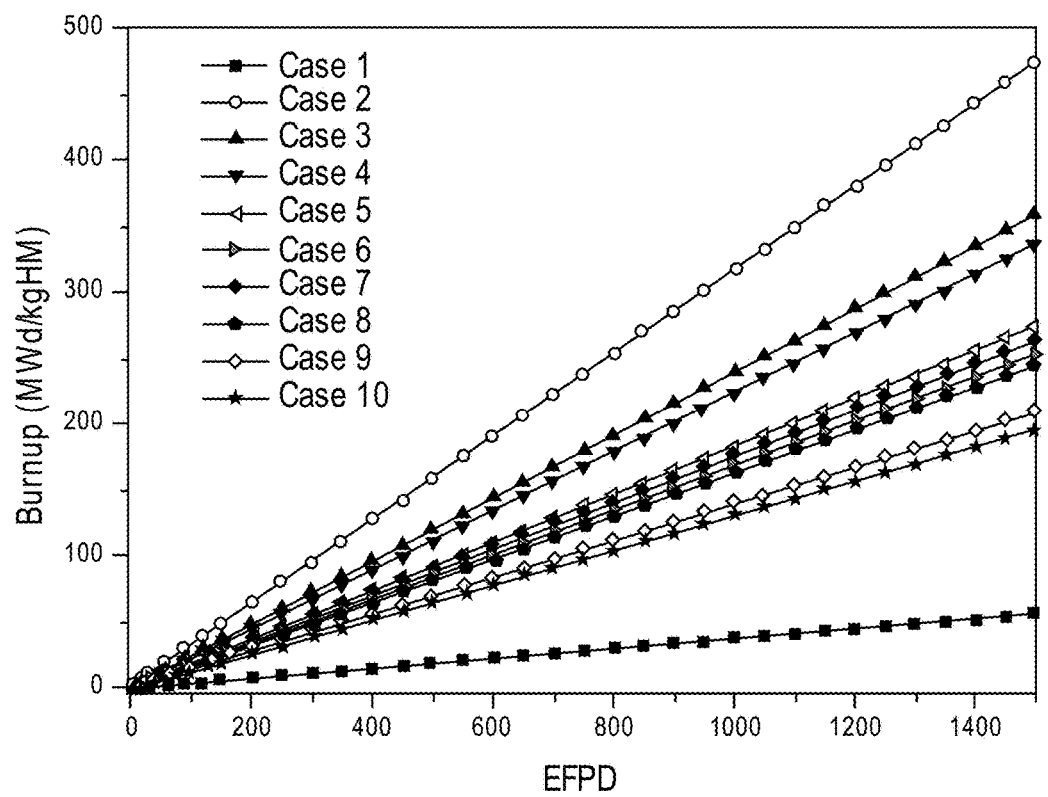
FIG. 12 is a graph illustrating the burnup changes of the various fuel arrangements.
Figure 13:
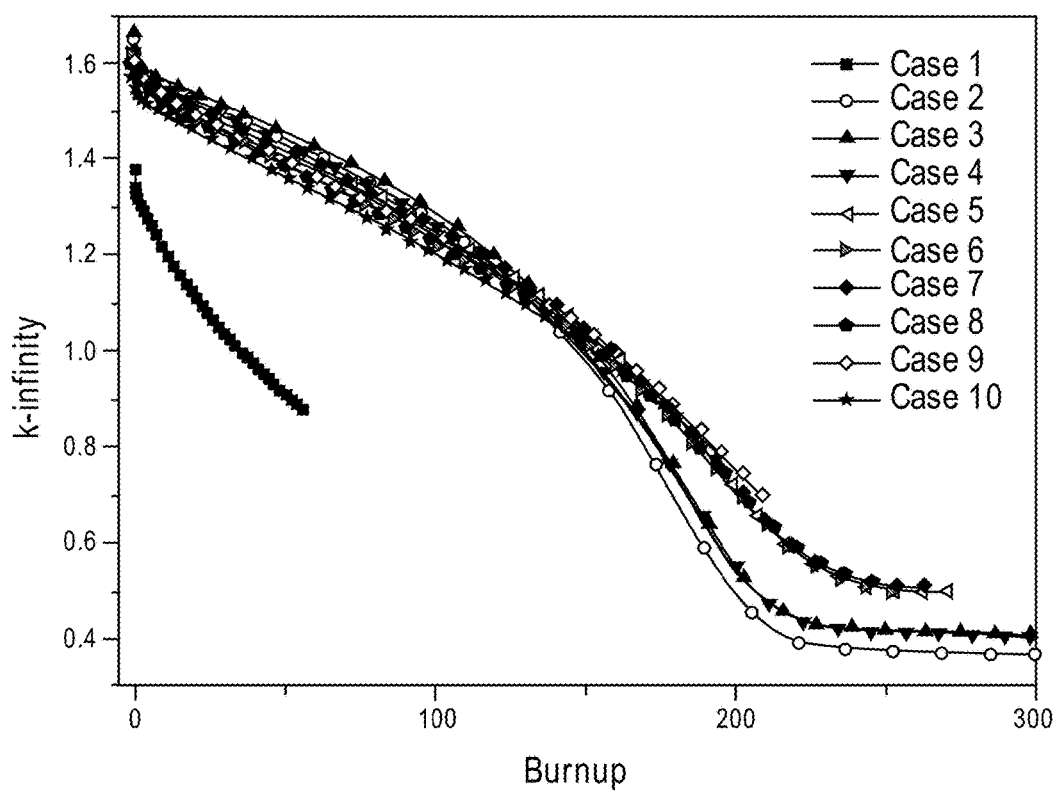
FIG. 13 is a graph coordinating the k-infinity evolution of FIG. 11 with the burnup changes of FIG. 12.

As shown in FIGS. 9-10, the nuclear fuel may use two or more sizes of TRISO particles in the compacts, which will increase the achievable packing fraction. The results of using different material and kernel sizes are reproduced in Tables 1-4 of FIGS. 14-17 and in FIGS. 11-13.

The porous carbon buffer layer 22 surrounds the fuel kernel 25 and serves as a reservoir for accommodating buildup of fission gases diffusing out of the fuel kernel 25 and any mechanical deformation that the fuel kernel 25 may undergo during the fuel cycle.

The inner PyC layer 24 may be formed of relatively dense PyC and seals the carbon buffer layer 22.

The ceramic layer 26 may be formed of a SiC material and serve as a primary fission product barrier and a pressure vessel for the fuel kernel 25, retaining gaseous and metallic fission products therein. The ceramic layer 26 also provides overall structural integrity of the fuel particle 20.

In some exemplary embodiments, the SiC layer 26 may be replaced or supplemented with zirconium carbide (ZrC) or any other suitable material having similar properties as those of SiC and/or ZrC.

The outer PyC layer 28 protects the SiC layer 26 from chemical attack during operation and acts as an additional diffusion boundary to the fission products. The outer PyC layer 28 may also serve as a substrate for bonding to the surrounding matrix material.

The configuration and/or composition of the fuel particle are not limited to the embodiments described above. Instead, it should be understood that a fuel particle consistent with the present disclosure may include one or more additional layers, or omit one or more layers, depending on the desired properties of the fuel particle. For example, the fuel particle 20 may be overcoated with the SiC matrix material (i.e., SiC layer) prior to being mixed and compressed with the SiC powder.

An exemplary method of fabricating the fuel element 10, according to another aspect of the present inventions, will be described herein.

To form the fuel particles 20, according to one exemplary embodiment, the material for the fuel kernel 25 may be dissolved in a nitric acid to form a solution (e.g., uranyl nitrate). The solution is then dropped through a small nozzle or orifice to form droplets or microspheres. The dropped microspheres are then gelled and calcined at high temperature to produce the fuel kernels 25. The fuel kernels 25 may then be run through a suitable coating chamber, such as a CVD furnace, in which desired layers are sequentially coated onto the fuel kernels 25 with high precision. It should be understood that any other fabrication method known in the art may be additionally or alternatively used to form the fuel kernels 25.

Once the fuel particles 20 are prepared, the fuel particles 20 are mixed with SiC powder, which comprises the precursor for the SiC matrix 15. Prior to the mixing, the fuel particles 20 may be coated with a suitable surface protection material. The SiC powder may have an average size of less than 1 µm and/or a specific surface area greater than 20 $m^2$/g. By way of example only, the size of the SiC powder may range from about 15 nm to about 51 nm with the mean particle size being about 35 nm.

During or prior to mixing, sintering additives, such as, for example, alumina and rare earth oxides, may be added to the SiC powder and/or coated onto the SiC powder surface. In one exemplary embodiment, the amount of additives may range from about 1 weight % to 10 weight %. When mixing with the fuel particles 20, the SiC-based precursor material containing the SiC powder may be in a variety of physical states (e.g., powder, liquid, slurry, etc.) depending on the mixing and/or fabrication method used.

The SiC-based precursor mixed with the fuel particles 20 may then be pressed to stress at a predetermined pressure and temperature to form the fuel element 10. According to one exemplary embodiment, the sintering pressure and temperature during the press may be less than about 30 MPa and 1900° C., respectively. Preferably, the sintering pressure and temperature may be about 10 MPa and 1850° C., respectively. The duration of the press may be less than or equal to about one hour, but it may take more than one hour.

The small size or large specific surface area of the SiC powder, with the limited mass fraction of the sintering additives, may enable the formation of highly crystalline, near-full density, SiC matrix at conditions sufficient to ensure the integrity of the fuel particles 20. The SiC matrix provides an additional barrier to fission products that may be released during normal operation and accident temperatures and contaminate the coolant of the reactor. The SiC matrix also helps contain fission products after disposal.

For example, FIG. 2 shows a microscopic, partial cross-sectional view of the fuel element 10 fabricated with a method consistent with the present inventions. As can be seen from the figure, the fuel element 10 has very clean interfaces between the fuel particles 20 and the SiC matrix 15. Further, the SiC matrix 15 has a very low porosity (e.g., only about 3~4% closed microporosity), forming a gas-impermeable barrier that acts as a secondary barrier to fission products/actinides diffusion and other radioactivity releases from the fuel particles 20.

In addition, the SiC matrix 15 has very low permeability to helium (e.g., in the order of about $10_{-10}$ to $10_{-11}$ $m_2$/s), which is substantially lower than that of graphite and makes it particularly suitable for a gas cooled reactor that uses helium as a coolant. Low permeability of the SiC matrix 15 may also ensure retention of fission product gas.

FIG. 3 illustrates a temperature gradient inside the fuel element 10 at an operating condition, with a comparison to a conventional $UO_2$ fuel element. As shown in the figure, the fuel element 10 consistent with the present inventions may have substantially higher thermal conductivity than that of the UO$_2$ fuel element. Higher thermal conductivity has many beneficial effects.

For example, higher thermal conductivity may permit operating the nuclear reactor at higher temperature. Operating a reactor at higher temperature may increase the efficiency and the power density, which may permit reduction of the reactor size. Higher thermal conductivity may also permit higher burnup of the fuel element while maintaining the overall fuel integrity. Moreover, as briefly mentioned above, higher burnup may not only reduce the overall waste volume but also limit possible nuclear proliferation and diversion opportunities. Furthermore, fuel with high thermal conductivity may undergo less severe temperature transients during an accident condition, such as a loss of coolant accident (LOCA). In light water reactor operating conditions, migration of fission products (including gases) outside the TRISO fuel particles and the SiC matrix is not expected to occur.

Further, the SiC matrix 15 has higher fracture strength, higher irradiation resistance, and lower irradiation swelling than graphite or UO$_2$. The combination of better irradiation performance and better thermal conductivity may result in better mechanical performance as compared to graphite or UO$_2$ fuel element. The resulting matrix 15 is considered a near-stoichiometric, radiation-resistant, form of SiC, allowing the fuel element 10 to be repository-stable for direct disposal even after substantial burnup (e.g., 60~99% burnup).

Figure 4:
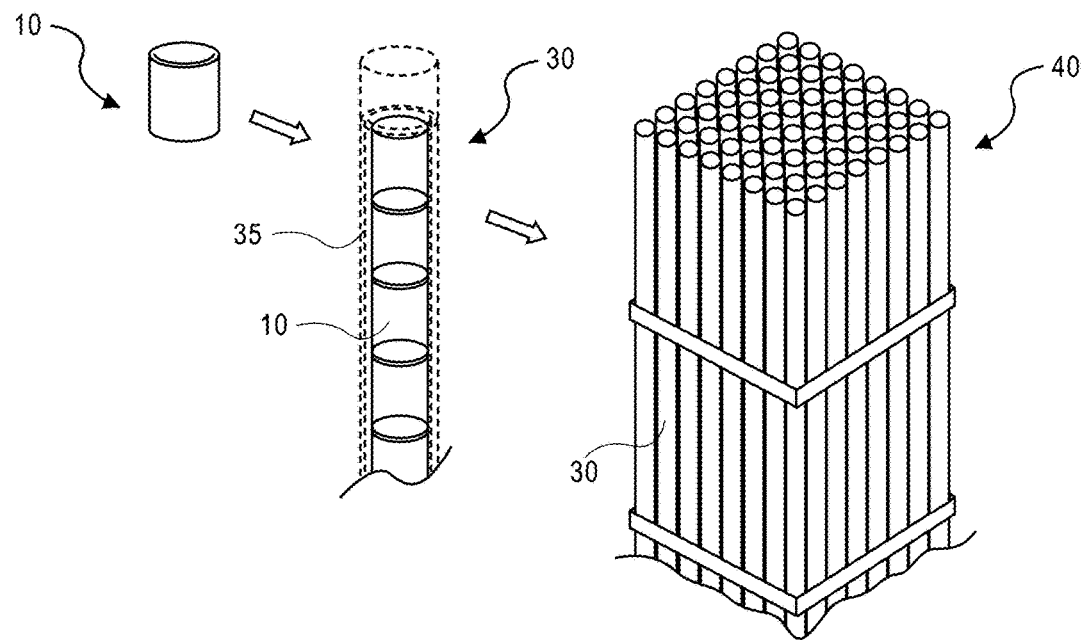
FIG. 4 is a schematic illustration of an exemplary application of the fuel element, consistent with the present inventions.
Figure 5:
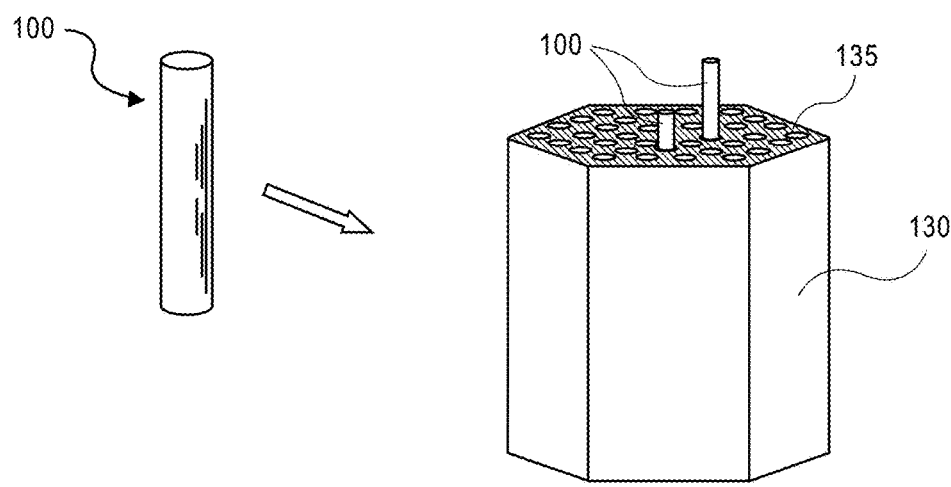
FIG. 5 is a schematic illustration of another exemplary application of the fuel element, consistent with present inventions.

Now, with reference to FIGS. 4 and 5, exemplary applications of the fuel element 10, according to various aspects of the present inventions, are described.

In one exemplary embodiment, one or more fuel elements 10 may be enclosed in a metallic cladding tube 35 or any other suitable enclosure to form a fuel rod 30, as shown in FIG. 4. When the fuel elements 10 are enclosed inside the cladding tube 35 or an enclosure, the cladding tube 35 or the enclosure may provide an additional barrier (i.e., in addition to the pressure-bearing ceramic coating around the fuel kernel 25 and the fully ceramic SiC matrix 15) to fission products and actinide transport from the fuel particles 20. One or more fuel rods 30 may then be placed in a fuel bundle 40 for use in, for example, a light water reactor. Thus, according to one exemplary aspect, the fuel element 10 consistent with the present inventions may be used in a conventional light water reactor, as replacement fuel for conventional UO$_2$ fuel pellets, which may provide enhanced thermal conductivity and irradiation stability, as well as added barriers to fission product and actinide transport.

According to another aspect of the present inventions, the fuel element may be provided as an elongated rod fuel element 100, as shown in FIG. 5. The fuel element 100 may be placed in a hole 135 drilled in a graphite prism 130 or block for use in a gas-cooled reactor. As mentioned above, the fully ceramic fuel element 100, consistent with the present inventions, may exhibit higher fracture strength, higher irradiation resistance, and lower irradiation swelling than the conventional graphite matrix-based fuel.

Other embodiments of the inventions will be apparent to those skilled in the art from consideration of the specification and practice of the inventions disclosed herein. It is intended that the specification and examples be considered as exemplary only, with a true scope and spirit of the inventions being indicated by the following claims.

What is claimed is:

1. A nuclear fuel comprising:
a dispersion-ceramic micro-encapsulated fuel comprising a plurality of tristructural-isotropic (TRISO) fuel particles embedded in a silicon carbide matrix;
wherein the plurality of TRISO fuel particles each include one or more layers of isotropic materials surrounding a fuel kernel and the fuel kernel is surrounded by a porous carbon buffer layer, an inner pyrolytic carbon layer, a ceramic layer, and an outer pyrolytic carbon layer;
wherein the ceramic layer is formed of a silicon carbide layer supplemented with a zirconium carbide; and
wherein the plurality of TRISO fuel particles includes two or more different sizes of TRISO fuel particles, including a first TRISO fuel particle having a first fuel kernel with a first kernel radius of no more than 375 micrometers and a first packing fraction of no more than 45% and a second TRISO fuel particle having a second fuel kernel with a second kernel radius of no more than 200 micrometers and a second packing fraction of no more than 3%.

2. The nuclear fuel of claim 1, wherein the dispersion-ceramic micro-encapsulated fuel is comprised of heavy metal materials providing higher density than uranium dioxide.

3. The nuclear fuel of claim 2, wherein the heavy metal materials are selected from a group consisting of uranium nitride, uranium carbide, and uranium silicide.

4. The nuclear fuel of claim 3, wherein the fuel includes resonant absorbers selected from a group consisting of gadolinium or erbium.

5. The nuclear fuel of claim 1, wherein the silicon carbide matrix comprises silicon carbide powder mixed with sintering additives.

6. The nuclear fuel of claim 1, wherein the fuel kernel includes a fissile material and a fertile material in an oxide, carbide, or oxycarbide form.

7. The nuclear fuel of claim 6, wherein the fertile material is selected from a group consisting of uranium, plutonium, or thorium.

8. The nuclear fuel of claim 1, wherein the fuel kernel comprises low enriched uranium.

9. The nuclear fuel of claim 1, wherein the porous carbon buffer layer surrounds the fuel kernel and is a reservoir for accommodating buildup of fission gases diffusing out of the fuel kernel and mechanical deformation that the fuel kernel undergoes during a fuel cycle.

10. The nuclear fuel of claim 1, wherein the ceramic layer is formed of silicon carbide material.

11. The nuclear fuel of claim 1, wherein the first TRISO fuel particle has a pellet radius between 0.4095 and 0.4709 centimeters and a pellet height of 1 centimeter.

12. The nuclear fuel of claim 11, wherein:
the porous carbon buffer layer of the first TRISO fuel particle has a porous carbon buffer layer radius of 0.0475 centimeters;
the inner pyrolytic carbon layer of the first TRISO fuel particle has an inner pyrolytic carbon radius of 0.0510 centimeters;
the ceramic layer of the first TRISO fuel particle has a ceramic layer radius of 0.0545 centimeters; and
the outer pyrolytic carbon layer of the first TRISO fuel particle has an outer pyrolytic carbon layer radius of 0.0585 centimeters.

13. The nuclear fuel of claim 12, wherein the second TRISO fuel particle has a pellet radius of 0.4709 centimeters and a pellet height of 1 centimeter.

14. The nuclear fuel of claim 13, wherein:
the porous carbon buffer layer radius of the second TRISO fuel particle is 0.0300 centimeters;
the inner pyrolytic carbon layer radius of the second TRISO fuel particle is 0.0335 centimeters;
the ceramic layer radius of the second TRISO fuel particle is 0.0370 centimeters; and
the outer pyrolytic carbon layer radius is 0.0410 centimeters.

15. The nuclear fuel of claim 14, wherein the fuel kernel comprises uranium nitride.

16. The nuclear fuel of claim 14, wherein the fuel kernel comprises uranium carbide.

* * * * *